United States Patent [19]
Kato et al.

[11] 4,333,064
[45] Jun. 1, 1982

[54] SWITCHED-CAPACITOR FILTER

[75] Inventors: Seiji Kato, Yamato; Norio Ueno, Kawasaki; Mitsuo Kakuishi, Yokohama; Akihiko Ito, Kawasaki; Atsushi Iwata, Tokorozawa, all of Japan

[73] Assignees: Fujitsu Limited, Kawasaki; Nippon Telegraph & Telephone Public Corporation, Tokyo, both of Japan

[21] Appl. No.: 152,558

[22] Filed: May 23, 1980

[30] Foreign Application Priority Data

May 28, 1979 [JP] Japan ................................. 54-65828

[51] Int. Cl.$^3$ ........................................... H03H 19/00
[52] U.S. Cl. ..................................... 333/173; 328/151
[58] Field of Search ............................. 333/167–168, 333/173, 174, 18, 28 R, 172; 328/162, 165, 127, 167, 150–151, 142–143, 37; 307/238.1, 238.2, 238.3, 238.8

[56] References Cited

U.S. PATENT DOCUMENTS

| | | | |
|---|---|---|---|
| 3,588,531 | 6/1971 | Bjor | 328/151 X |
| 3,621,402 | 8/1971 | Gardner | 328/167 X |
| 3,852,619 | 12/1974 | Carbrey | 328/151 X |

*Primary Examiner*—Marvin L. Nussbaum

[57] ABSTRACT

A switched-capacitor filter provided with, at its input stage, a prefilter comprised only of a plurality of additional switched capacitors together with a switched capacitor common to the switched-capacitor filter. The switched capacitor common to the switched-capacitor filter is driven by primary clock pulses having a period T, while the additional switched capacitors are sequentially driven by secondary clock pulse groups. Each of the secondary clock pulse groups has the same period T, and the phases of the second clock pulse groups are shifted by $T/2^k$, $2T/2^k$, $3T/2^k$ ... $(2^k-1)T/2^k$ with respect to the first clock pulses (k is a positive integer). The sampled and held signals in the switched capacitors are supplied synchronously to the switched-capacitor filter.

12 Claims, 13 Drawing Figures

SWITCHED-CAPACITOR FILTER

BACKGROUND OF THE INVENTION

The present invention relates to a switched-capacitor filter having, at its input stage, a prefilter.

Stimulated by progress in MOS (metal oxide semiconductor) technology, considerable interest has recently arisen in the possibility of a filter realized by means of switched-capacitors, i.e. a switched-capacitor filter (hereinafter often referred to by the abbreviation "SCF"). The major advantages of the SCF reside in the facts that only capacitors, operational amplifiers, and switches are needed, that nearly perfect switches can easily be built, and, especially, that all resonant frequencies are determined exclusively by capacitance ratios. Therefore, the SCF is very useful in various kinds of electronic processing systems, for example, PCM (pulse code modulation) communication systems. In a PCM communication system, as will be explained hereinafter, a low-pass filter is one of the important electronic processing members. The low-pass filter operates in such a manner as to cut off signals having a frequency higher than 4 kHz and, accordingly, only voice signals can pass therethrough. In a PCM communications system, it is preferable to build the low-pass filter by means of the SCF.

Although the SCF has the above mentioned advantages, it also has the disadvantage that, generally, the SCF is driven through a sampling operation. The sampling frequency for achieving the sampling operation is, for example, 128 kHz. In this case, since the SCF processes successive sampled voice data synchronously with said sampling frequency, a so-called alias signal is generated. If the SCF receives a signal having the frequency of, for example, $(128+1)$ kHz, an undesired signal of 1 kHz appears as the alias signal in a base band signal. This signal of 1 kHz is not a true voice signal and, accordingly, it should be eliminated. Consequently, a prefilter is added to the input stage of the SCF, in order to suppress said signal of $(128+1)$ kHz. Generally, the prefilter should suppress signals of $[128n \pm (0\ \text{through}\ 4)]$ kHz $(n=1, 2, 3 \ldots)$ and their respective neighbouring signals, where the frequency of (0 through 4) kHz corresponds to the base band frequency representing the voice signal. Thus, the prefilter is also called an anti-alias filter.

In the prior art, the prefilter is built as a second order RC active filter which is comprised of an operational amplifier, capacitors and resistors. However, the second order RC active filter is not preferable as a prefilter from an economical point of view. This is because the active filter includes the operational amplifier which requires energizing power. That is, the power consumption is relatively large. This fact corresponds to the first diseconomy. Further, the single chip IC (integrated circuit) for fabricating the SCF is partially occupied by the operational amplifier of the RC active filter. That is, a high density IC can not be obtained due to the presence of the operational amplifier. This fact corresponds to the second diseconomy. It should be understood that, in each PCM communication system, since there are several thousand communication channels, several thousand operational amplifiers must be incorporated in the ICs. Accordingly, the power consumption becomes extremely large, and, moreover, a high density IC cannot be expected.

SUMMARY OF THE INVENTION

Therefore, it is an object of the present invention to provide a prefilter of the SCF, which prefilter is fabricated merely by simple passive electronic elements without employing an operational amplifier.

In the present invention, the prefilter can be fabricated by employing simple passive electronic elements without employing an operational amplifier. Generally speaking, in the SCF provided with, at its input stage, the prefilter according to the present invention, each period of the clock pulses for driving the SCF is divided into $2^k$ $(k=1, 2, 3 \ldots)$ sets of successive time intervals. $(2^k-1)$ units of switched capacitors are employed in addition to the conventional single switched capacitor, and each of the $(2^k-1)$ units of the switched capacitors samples and holds the input voice signal at each corresponding one of the $2^k$ sets of successive time intervals by means of switching means, and the sampled and held input voice signals are added synchronously to the input voice signal which is sampled and held in a switched capacitor of the SCF itself by means of said switching means, when this switched capacitor supplies the sampled and held input voice signal to the SCF.

BRIEF DESCRIPTION OF THE DRAWING

The present invention will be more apparent from the ensuing description with reference to the accompanying drawings, wherein.

DESCRIPTION OF THE PREFERRED EMBODIMENTS

Figure 1:
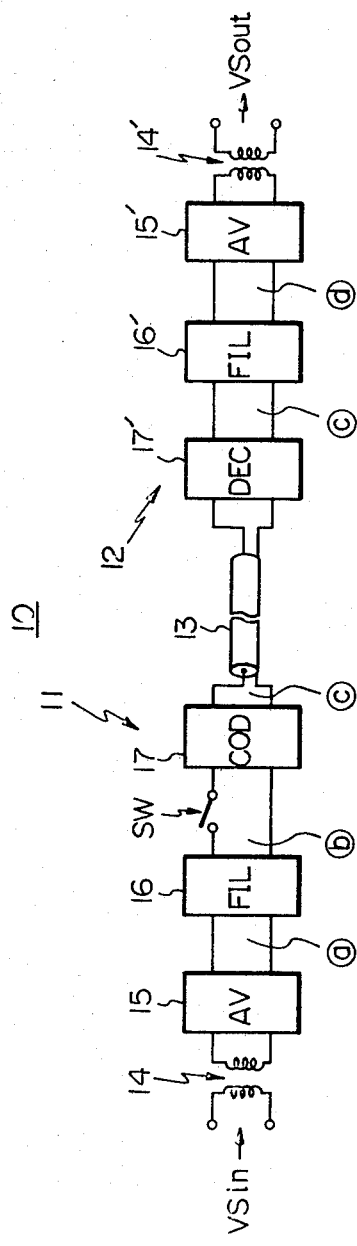
FIG. 1 is a schematic view illustrating a conventional PCM communication system.

In FIG. 1, which is a schematic view of a conventional PCM communication system, the system 10 is divided into a transmitter 11 and a receiver 12. The transmitter 11 and the receiver 12 are connected by way of a transmission line 13. In the transmitter 11, an input voice signal $VS_{in}$ is applied to a transformer 14. The input voice signal is next applied to a PCM channel filter (FIL) 16 via a variable attenuator (AV) 15. The variable attenuator 15 operates in such a manner as to adjust the level of the input voice signal. The analogue signal from the filter 16 is converted into a PCM digital voice signal by means of a coder (COD) 17. The coder 17 receives successive sample analogue signals via a switch SW. The switch SW is switched ON and OFF at a frequency of 8 kHz (selected according to the so-called sampling theorem).

In the receiver 12, the PCM digital voice signal is decoded by means of a decoder 17'. The decoded analogue signal, that is, an output voice signal $VS_{out}$, is produced from a transformer 14' via a filter (FIL) 16' and a variable attenuator (AV) 15'.

Figure 2:
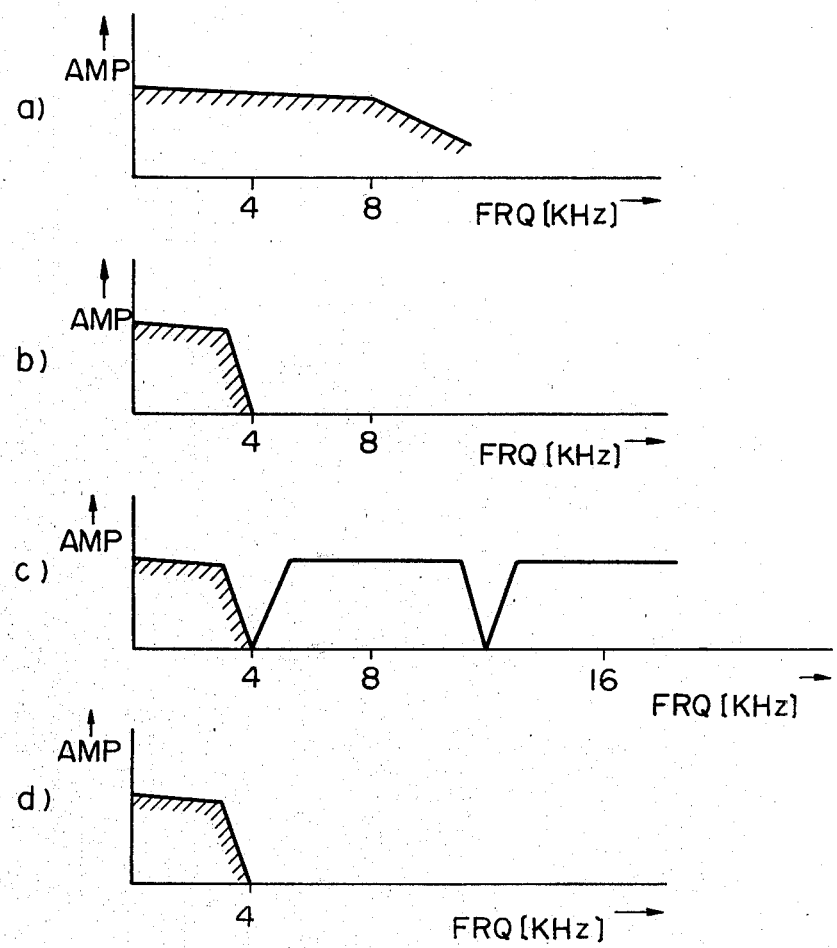
FIG. 2 contains graphs depicting the spectra of signals appearing at portions ⓐ , ⓑ , ⓒ , and ⓓ in FIG. 1.

The operation performed in the PCM communication system 10 will now be clarified with reference to FIG. 2. FIG. 2 contains graphs (a), (b), (c) and (d)) showing the spectra of signals appearing at the portions ⓐ , ⓑ , ⓒ and ⓓ , respectively, in FIG. 1. In each of the graphs (a) through (d), the ordinate indicates the amplitude (AMP) of the signal and the abscissa indicates the frequency (FRQ) thereof.

The present invention relates to the PCM channel filter 16 (FIG. 1) of the transmitter 11 (FIG. 1). The filter 16 operates in such a manner as to cut off signals having a frequency higher than 4 kHz and, accordingly, only voice signals are supplied to the switch SW, as will be understood from the graphs (a) and (b) of FIG. 2. The filter 16 is comprised of an SCF having, at its input stage, a prefilter which eliminates undesired alias signals from voice signals to be transmitted.

Figure 3:
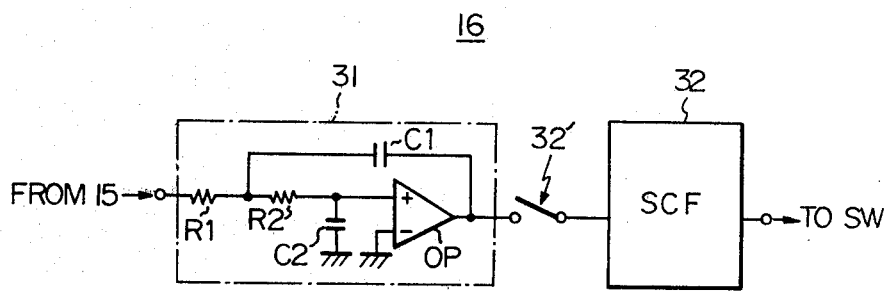
FIG. 3 schematically illustrates a prior art filter 16 in FIG. 1.
Figure 4:
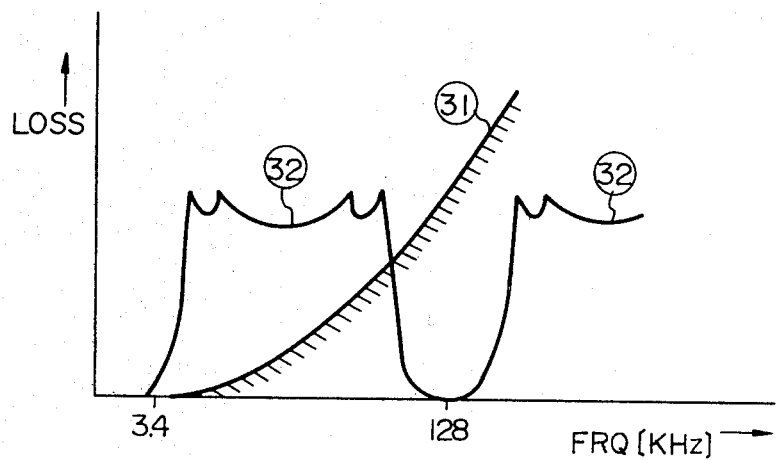
FIG. 4 is a graph depicting the loss (LOSS axis) versus frequency (FRQ axis) characteristics of signals obtained by the filter 16 in FIG. 3.

In the prior art, the prefilter is mainly comprised of an operational amplifier. FIG. 3 schematically illustrates the prior art filter 16. In this figure, the filter 16 is a combination of a prefilter 31, which is connected to the variable attenuator 15 (FIG. 1), and an SCF 32, which is connected to the coder 17 (FIG. 1). The SCF 32 acts as a low-pass filter and, accordingly, the SCF 32 has loss versus frequency characteristics as shown in FIG. 4. FIG. 4 is a graph depicting the loss of signals (LOSS) with respect to the frequency thereof (FRQ). The characteristic curve ㉜ of FIG. 4 corresponds to the loss versus frequency characteristics of the SCF 32. Referring to both FIGS. 3 and 4, since the SCF 32 is driven during the sampling operation by a sampling frequency of 128 kHz by a switching means 32', a so-called attenuation pole cannot be created at the frequency of 128 kHz and its neighbouring frequencies between two adjacent curves ㉜ . It should be noted that such attenuation pole can also not be created at each of the frequencies of 128n (n=2, 3, 4 . . . ) and respective neighbouring frequencies. Therefore signals of 128n±(0 through 4) kHz are not suppressed by the SCF 32. In this case, the signals of (0 through 4) kHz appear, as alias signals, in the base band signal (voice signal), and accordingly, a high quality of voice signal transmission can not be achieved. In order to eliminate the occurrence of the alias signals in the voice signals, the prefilter 31 is very useful. The prefilter 31 produces the loss-frequency characteristic curve ㉛ of FIG. 4. Thus, the attenuation can also be created between two adjacent curves ㉜ by means of the prefilter 31, with the result that no alias signals appear in the voice signals. However, as seen in FIG. 3, since the prefilter 31 is fabricated with the operational amplifier OP, and also resistors R1 and R2 and capacitors C1 and, C2, the power consumption becomes large and a high density IC cannot be obtained.

In the present invention, the prefilter can be fabricated by employing simple passive electronic elements without employing an operational amplifier. Generally speaking, in the SCF provided with, at its input stage, the prefilter according to the present invention, each period of the clock pulses for driving the SCF is divided into $2^k$ (k=1, 2, 3 . . . ) sets of successive time intervals ($2^K-1$) units of switched capacitors are employed in addition to the conventional single switched capacitor, and each of the ($2^k-1$) units of the switched capacitors samples and holds the input voice signal at each corresponding one of the $2^k$ sets of successive time intervals by means of switching means, and the sampled and held input voice signals are added synchronously to the input voice signal which is sampled and held in a switched capacitor of the SCF itself by means of said switching means, when this switched capacitor supplies the sampled and held input voice signal to the SCF.

Figure 5:
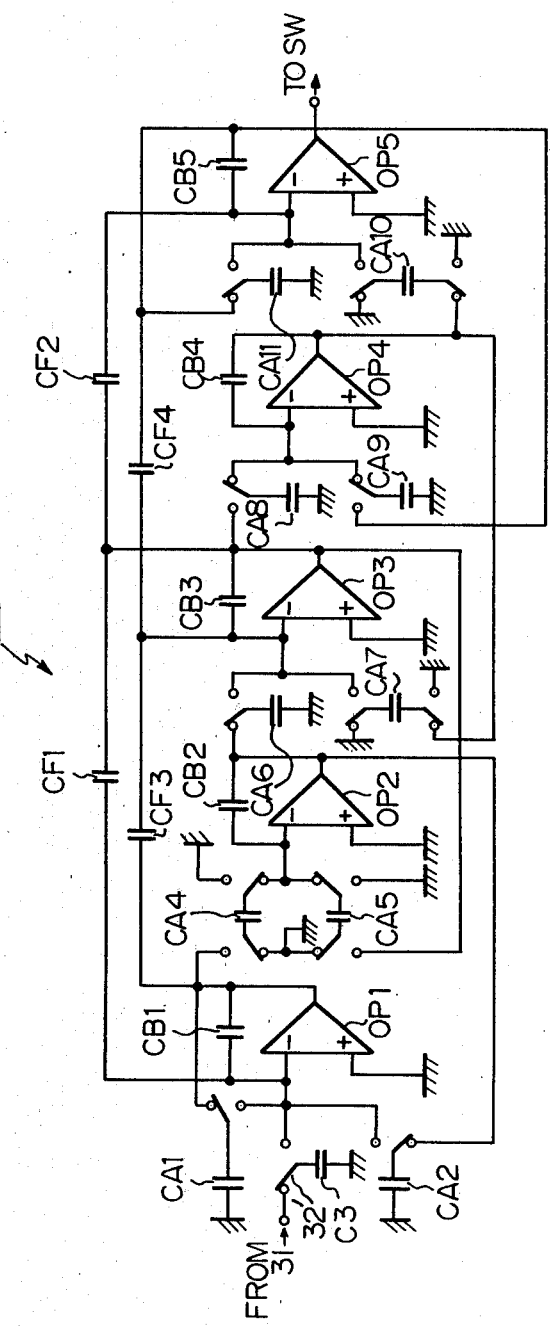
FIG. 5 is a circuit diagram illustrating details of a prior art SCF 32 and a switching means 32' in FIG. 3.

FIG. 5 is a circuit diagram illustrating details of the prior art SCF 32 and the switching means 32' in FIG. 3. The SCF 32 and the switching means 32' act as a low-pass filter having loss-frequency characteristics ㉜ in FIG. 4. Since the SCF 32 itself is not an essential part of the present invention and, also, since the SCF 32 is known from publications, for example, David J. Allstat et al: "Fully-Integrated High-Order NMOS Sampled Data Ladder Filters," ISSCC 78, P. 82, details of the operation of the SCF 32 will not be explained here. In FIG. 5, the reference symbols OP1 through OP5 represent operational amplifiers. These five operational amplifiers construct a five order low-pass SCF. The reference symbols CB1 through CB5 represent integration capacitors. The reference symbols CA1 through CA11 represent switched capacitors acting as resistors. The reference symbols CF1 through CF4 represent feedback capacitors.

Figure 6:
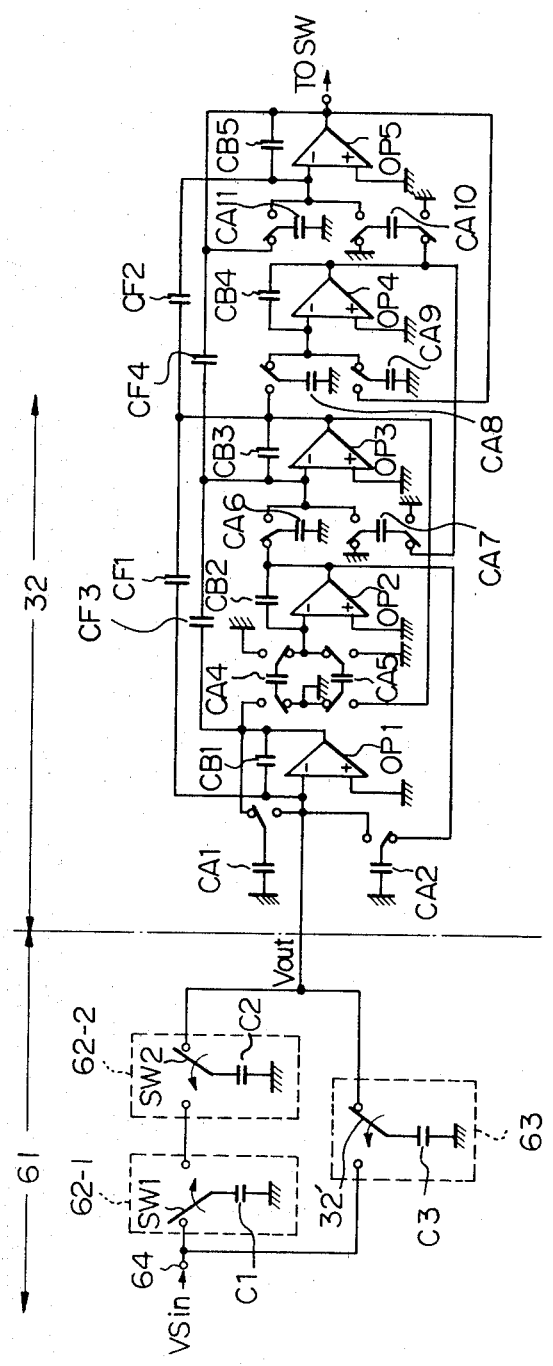
FIG. 6 is a circuit diagram illustrating one example of a first embodiment of the present invention.

As mentioned previously, the prefilter of the present invention is fabricated merely by $2^k$ units of the switched capacitors. In order to facilitate understanding the prefilter according the present invention, a case where k=1 is taken as an example. FIG. 6 is a circuit diagram illustrating one example of a first embodiment of the prefilter according to the present invention, used with an SCF 32. In FIG. 6, the SCF 32 has, at its input stage, the prefilter 61. When k=1, as previously mentioned, one ($2^k-1=2^1-1=1$) newly employed switched capacitor in addition to the pre-existing conventional switched capacitor, that is two switched capacitors in all, comprise the prefilter. In this case, it may be necessary to use primary clock pulses for driving the prefilter and secondary clock pulses for driving the following low-pass filter, where the primary clock pulses are different from the secondary clock pulses. However, in FIG. 6, because there are *two* newly employed switched capacitors 62-1 and 62-2 (three in all), both the prefilter and the following low-pass filter can be driven by the same clock pulses. Each of the switched capacitors 62-1 and 62-2 is comprised of a switching means plus a capacitor, such as SW1 plus C1 and SW2 plus C2. It should be noted that the switching means 32' plus the capacitor C3 forms another switched capacitor 63, which functions as a part of the prefilter 61. However, the switched capacitor 63 is common to the conventional SCF 32. As mentioned above, the switching means 32' is switched ON and OFF at the sampling frequency of 128 kHz, which is the same as the frequency of the clock pulses used for activating the switching means of the SCF 32.

The operation of the prefilter will now be explained with reference to FIGS. 6 and 7. The input voice signal $VS_{in}$ from the variable attenuator 15 (FIG. 1) is applied to an input terminal 64. The signal $VS_{in}$ is sampled and held by the switched capacitors 62-1, 62-2, and 63, and transferred to the input of the SCF 32. The switched capacitor 63 which is common to the SCF 32, is driven by primary clock pulses P1 having a period T (see row a) of FIG. 7). The switched capacitors 62-1 and 62-2 are driven both by the primary clock pulses P1, and also by secondary clock pulses P2 which are shifted in phase by a predetermined amount (see row b) of FIG. 7).

The switching means SW2 operates in phase with the switching means 32', but the switching means SW1 operates in opposite phase with respect to said switching means SW2 and 32'. Phase relationship between these switching means is clarified by the switched conditions thereof shown in FIG. 6.

Figure 7:
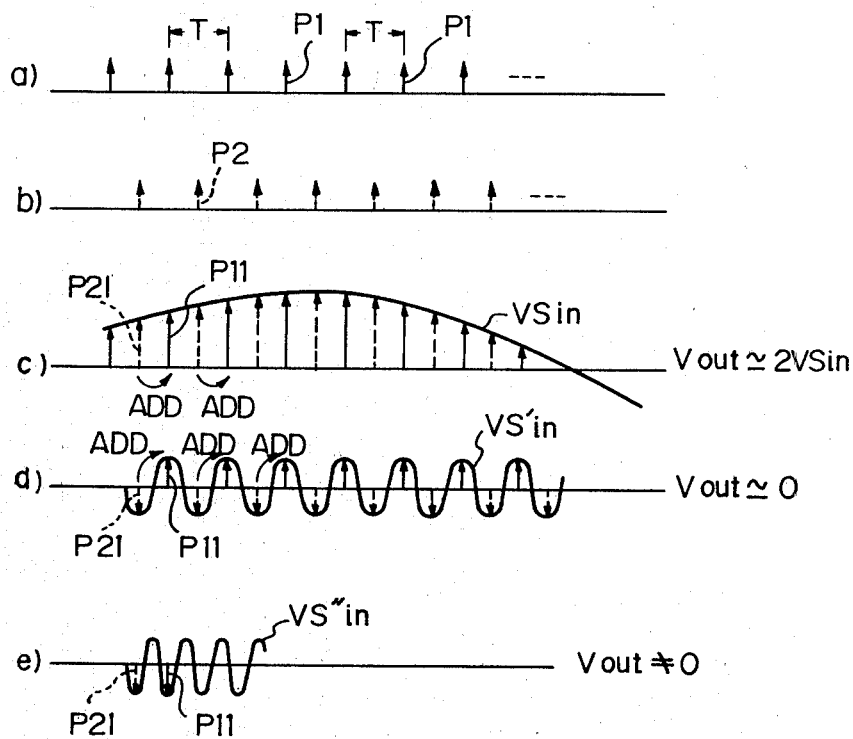
FIG. 7 depicts timing charts used for explaining the operation of the prefilter 61 in FIG. 6.

When an ordinary input voice signal $VS_{in}$ (see curve $VS_{in}$ in row c) of FIG. 7) is applied to the input terminal 64, first the signal $VS_{in}$ is sampled by the pulse P21 and held in the capacitor C1. Soon after the occurrence of the pulse P21, the capacitor C1 discharges its sampled and held signal $VS_{in}$ to the capacitor C2. Accordingly, the capacitor C2 holds the $VS_{in}$ at the pulse P21. On the other hand, the capacitor C3 samples the signal $VS_{in}$ and holds the signal $VS_{in}$ which has been obtained immediately before the occurrence of the pulse P11. Thereafter, when the pulse P11 occurs, the signal $VS_{in}$ held in the capacitor C2 and the signal $VS_{in}$ held in the capacitor C3 are added and supplied to the input of the SCF 32. Consequently, the sampled signal $VS_{in}$ has an amplitude higher than, by about two times, the amplitude of the sampled signal $VS_{in}$ which is produced in the prior art filter illustrated in FIG. 3. Refer to the expression $V_{out} \simeq 2 \, VS_{in}$ in the row (c) of FIG. 7. $V_{out}$ is an output voltage at the output of the prefilter 61 in FIG. 6.

When the input voice signal includes the signal $VS_{in}'$ having a frequency of $(128-4)$ kHz through $(128+4)$ kHz (see $VS_{in}'$ in row d) of FIG. 7), the previously mentioned alias signal having a frequency of 0 through 4 kHz appears as a noise signal in the base band signal, that is the ordinary output voice signal $VS_{out}$ (FIG. 1). This is because, as previously explained, the frequency of the signal $VS_{in}'$, that is $128 \pm (0$ through $4)$ kHz, substantially coincides with the frequency (128 kHZ) of the primary clock pulses P1 by which the SCF 32 and the switched capacitor 63 are driven. Therefore, the signal $VS_{in}'$ of row (d) must be prevented from being supplied to the input of the SCF 32.

The prefilter 61 can easily suppress such a signal $VS_{in}'$. The reason for this will now be clarified with reference to row (d) of FIG. 7 and also FIG. 6. The operation of processing the signal $VS_{in}'$ is similar to the operation discussed with reference to row (c) of FIG. 7. In other words, a signal $VS_{in}'$ having negative amplitude at the pulse P21 is delayed by the time T/2, and is added to a signal $VS_{in}'$ having positive amplitude at the pulse P11. Consequently, these two adjacent signals $VS_{in}'$ appearing at the pulses P21 and P11, cancel each other (see the equation $V_{out} \simeq 0$ in the row (d)). As a result, the signal $VS_{in}'$ is prevented from passing through the SCF 32, and accordingly, no alias signal appears in the base band signal.

Figure 8:
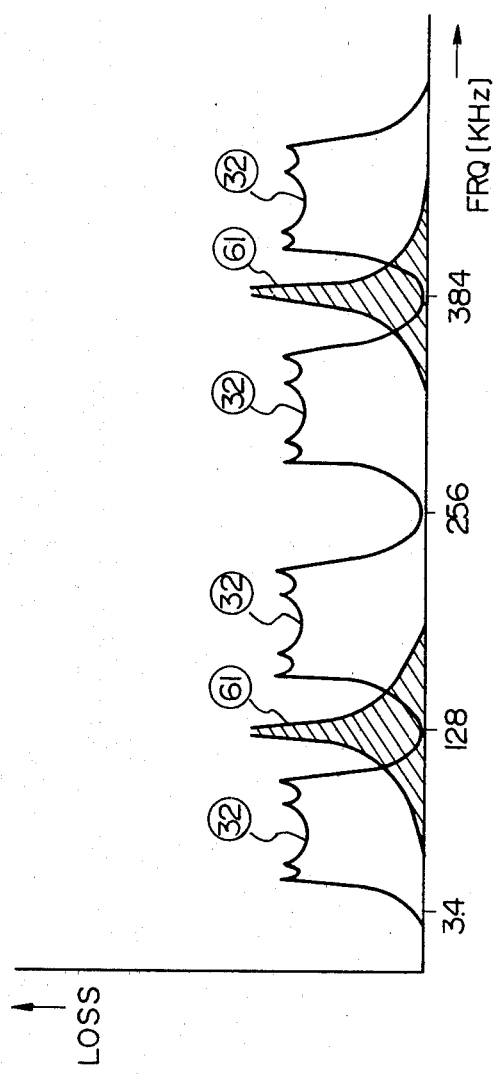
FIG. 8 is the graph depicting loss (LOSS axis) versus frequency (FRQ axis) characteristics of signals obtained by a prefilter 61 in FIG. 6.

The loss-frequency characteristics obtained in the prefilter 61 are indicated in FIG. 8. FIG. 8 is a graph depicting the attenuation of a signal (LOSS) with respect to the frequency thereof (FRQ). The characteristic curves 32 are identical to those shown in FIG. 4. However, the characteristic curve 61 of the prefilter 61 is very different from the characteristic curve 31, shown in FIG. 4, of the prefilter 31 in FIG. 3. Although the curve 61 is different from the curve 31, it is apparent from FIG. 8 that the prefilter 61 can also create an attenuation pole at the frequency $[128 \pm (0$ through $4)]$ kHz.

However, the prefilter 61 only creates the attenuation poles at frequencies of $[128n \pm (0$ through $4)]$ kHz, where the positive integer n is limited to an odd number, such as 1, 3, 5, 7 .... This can be seen in FIG. 8, in which, for example, the desired attenuation pole at the frequency 256 khZ ($128 \times 2$) and the neighbouring frequencies, is not created. Therefore, the prefilter 61 cannot eliminate signals having the frequencies $[128 \times 2l \pm (0$ through $4)]$ kHz (l a positive integer) from the input voice signal $VS_{in}$. In this case, alias signals having the frequencies $\{128 \times 2l - [128 \times 2l \pm (0$ through $4)]\}$ kHz, may appear in the base band signal. However, such alias signals can easily be suppressed by an appropriate means without using the prefilter, for example, by a simple and typical RC passive filter which may be located at the input terminal 64 (FIG. 6). Also, such signals have already been suppressed by the transformer 14 (FIG. 1). Thus, it is not necessary for the prefilter 61 to eliminate the signals having the frequencies $[128 \times 2l \pm (0$ through $4)]$ kHz.

The reason such signals pass through the prefilter 61, may be clarified with reference to row (e) of FIG. 7. The signal $VS_{in}''$ of row (e) has the frequency $[128 \times 2l \pm (0$ through $4)]$ kHz, where l equals, for example, 1. Since the signals $VS_{in}''$ sampled at the pulses P21 and P11 have the same polarity, these sampled signals do not cancel each other (see the equation $V_{out} \neq 0$ of the row (e)).

Figure 9A:
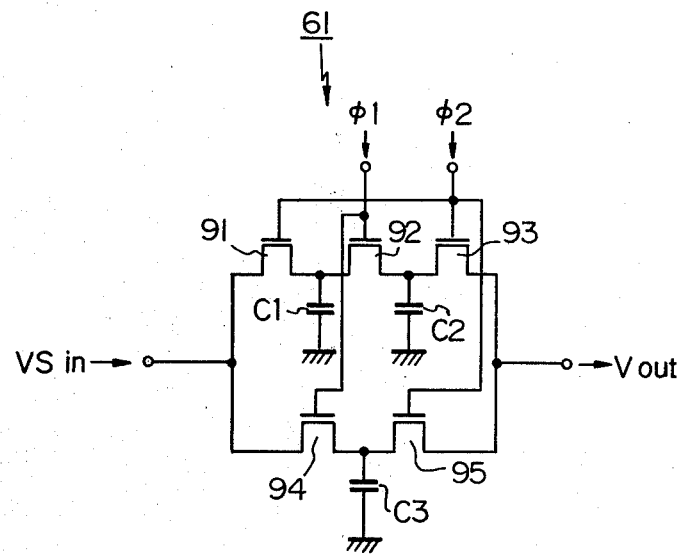
FIG. 9A is a circuit diagram illustrating the actual construction of the prefilter 61 in FIG. 6.
Figure 9B:
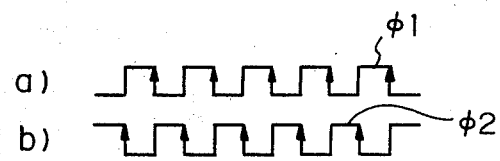
FIG. 9B illustrates waveforms of clock pulses $\phi 1$ and $\phi 2$ in FIG. 9A.

The prefilter 61 of FIG. 6 may actually be fabricated as illustrated in FIG. 9A. In FIG. 9A, the capacitors C1, C2, and C3 are identical to those of FIG. 6. The switching means SW1 of FIG. 6 is fabricated by FETs (field effect transistors) 91 and 92. The switching means SW2 of FIG. 6 is fabricated by the FET 92 and an FET 93. The FET 92 is common to both of the switching means SW1 and SW2. The switching means 32' of FIG. 6 is fabricated by FETs 94 and 95. The switching operations of the switching means (SW1, SW2, 32') can be performed by applying clock pulses $\phi 1$ and $\phi 2$ to respective gates of the FETs. The waveforms of the clock pulses $\phi 1$ and $\phi 2$ are illustrated in rows (a) and (b) of FIG. 9B, respectively. The arrows shown in row (a) correspond to the arrows shown in row (a) of FIG. 7. The arrows shown in row (b) correspond to the arrows shown in row (b) of FIG. 7. When the clock pulses are logic "1" (high) or logic "0" (low), the FETs become conductive or non-conductive, respectively.

In FIG. 9A, when the capacitance value of the capacitor C3 is determined to be C, the capacitance value of the capacitor C1 and also the capacitance value of the capacitor C2 are determined to be 2C, respectively. Accordingly, the capacitance ratios C1/C3 and C2/C3 are equal to 2, respectively. When the FET 92 becomes conductive, the capacitor C1 and C2 are connected in series. Then, half of the terminal voltage of the capacitor C1 appears at the terminal of the capacitor C2. However, since the terminal voltage of the capacitor C2 must be equal to that of the capacitor C3, in order to satisfy the expression $V_{out} \simeq 0$ in the row (d) of FIG. 7, the ratios C2/C3 and C1/C3 are determined to be equal to 2.

Figure 10:
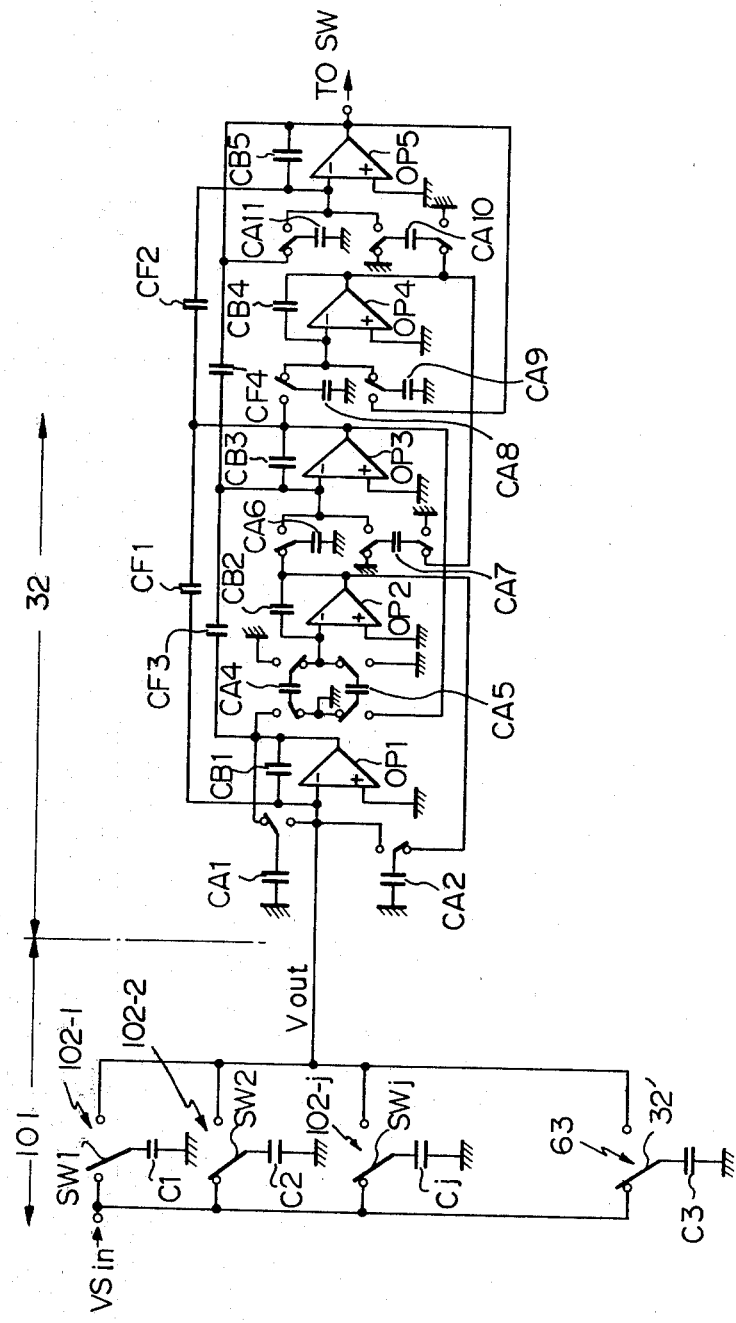
FIG. 10 is a circuit diagram illustrating a second embodiment of the present invention.

FIG. 10 is a circuit diagram of a second embodiment of the present invention. In FIG. 10, the members represented by the same reference numerals or symbols as those indicated in FIG. 6 are identical to those members in FIG. 6. The prefilter 101 is comprised of $2^k$ units of switched capacitors 102-1, 102-2 . . . 102-j, where $j=2^{k-1}$, and the switched capacitor 63. The switched capacitors 102-1 through 102-j sequentially sample the input voice signal $VS_{in}$ at each corresponding interval of the secondary clock pulses, where the phases of the secondary clock pulses are shifted by $T/2^k$, $2T/2^k$ . . . $(2^k-1)T/2^k$ with respect to the primary clock pulses. However, these switched capacitors 102-1 through 102-j discharge the input signals $VS_{in}$ held in respective switched capacitors simultaneously at a time which is synchronous with the primary clock pulses having the period T. Accordingly, each of the switched capacitors 102-1 through 102-j functions in such a manner as to store the sampled input voice signal $VS_{in}$ until all of the switched capacitors are discharged simultaneously.

Figure 11A:
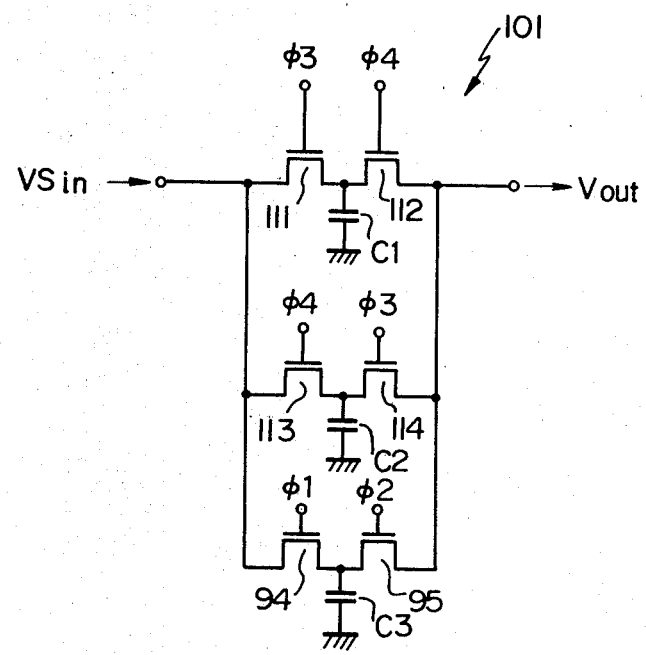
FIG. 11A is a circuit diagram illustrating an actual construction of the prefilter 101 in FIG. 10; and, FIG. 11B illustrates waveforms of clock pulses $\phi 1$, $\phi 2$, $\phi 3$ and $\phi 4$ in FIG. 11A.
Figure 11B:
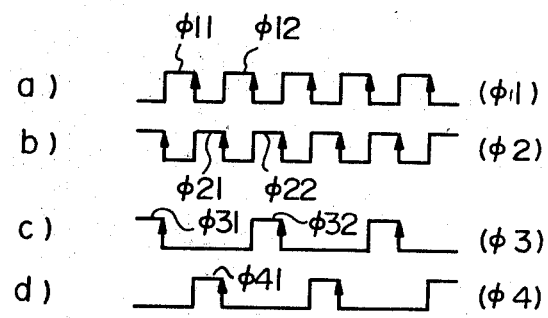

FIG. 11A is a circuit diagram illustrating an actual construction of the prefilter 101 in FIG. 10, taking as an example a case where j=1, that is, k equal to 1 ($2^1-1$). When j=1, the prefilter can, in principle, be comprised of two switched capacitors, that is an additional switched capacitor plus the single conventional switched capacitor. However, in this case, it may be necessary to use primary clock pulses for driving the prefilter and secondary clock pulses for driving the following low-pass filter, where said primary and secondary clock pulses are different from each other. In FIG. 11A, since two switched capacitors are newly employed (three capacitors in all), both the prefilter and the following low-pass filter can be driven by the same clock pulses. In FIG. 11A, FETs 111 through 114, 94, and 95 act as the switching means. These FETs are switched ON and OFF by clock pulses $\phi 1$, $\phi 2$, $\phi 3$, and $\phi 4$. The waveforms of these clock pulses $\phi 1$ through $\phi 4$ are illustrated in rows (a) through (d) of FIG. 11B, respectively. When each clock pulse is logic "1" (high) or logic "0" (low), the FET is switched ON or OFF, respectively. Referring to both FIGS. 11A and 11B, when the FET 111 is made conductive by the pulse $\phi 31$, the signal $VS_{in}$ is sampled and stored in the capacitor C1. The stored signal $VS_{in}$ is discharged through the FET 112 when it is made conductive by the pulse $\phi 41$. At the same time, the FET 95 is made conductive by the pulse $\phi 21$. Accordingly, the stored signal $VS_{in}$ in the capacitor C1 is added to the stored signal $VS_{in}$ in the capacitor C3 (refer to "ADD" in row (d) of FIG. 7). The signal $VS_{in}$ stored in the capacitor C3 is obtained when the FET 94 is made conductive by the pusle $\phi 11$. Similarly, when the FET 113 is made conductive by the pulse $\phi 41$, the signal $VS_{in}$ is sampled and stored in the capacitor C2. The stored signal $VS_{in}$ is discharged through the FET 114 when it is made conductive by the pulse $\phi 32$. At the same time, the FET 95 is made conductive by the pulse $\phi 22$. Accordingly, the stored signal $VS_{in}$ in the capacitor C2 is added to the stored signal $VS_{in}$ in the capacitor C3. The signal $VS_{in}$ stored in the capacitor C3 is obtained when the FET 94 is made conductive by the pulse $\phi 12$.

The combination of the clock pulses $\phi 1$ and $\phi 2$ corresponds to the clock pulses shown in row (b) of FIG. 7, that is, the secondary clock pulses P2. The combination of the clock pulses $\phi 3$ and $\phi 4$ acts as additional clock pulses with respect to the secondary clock pulses P2.

The prefilter 101 of FIG. 11A has an advantage in that the prefilter 101 can be fabricated from similar units, where each of the units is comprised of two FETs and one capacitor.

As mentioned above, according to the present invention, the prefilter (61 or 101) can be fabricated merely by simple electronic elements, such as switched capacitors, without using an operational amplifier. Therefore, the power consumption of the band pass filter can be reduced from that in the prior art and, further, a high density IC can be achieved.

We claim:

1. A prefilter for the input stage of a switched-capacitor filter, said switched-capacitor filter comprising a switched capacitor and associated switching means common to said switched-capacitor filter and said prefilter, and being driven by primary clock pulses having a period T for sampling an input signal to be supplied to said switched-capacitor filter via said prefilter, wherein said prefilter comprises:

$(2^k-1)$ (k being a positive integer) units of switched capacitors;

means for providing secondary clock pulse groups to drive said $(2^k-1)$ units of switched capacitors, each of said secondary clock pulse groups having the same period T and the phases of said secondary clock pulse groups being shifted by $T/2^k$, $2T/2^k$, $3T/2^k$ . . . $(2^k-1)T/2^k$ with respect to said primary clock pulses;

said switched capacitor common to said switched-capacitor filter and said prefilter being driven by said primary clock pulses;

wherein each of said $(2^k-1)$ units of switched capacitors samples and holds the input signal at each corresponding one of said secondary clock pulse groups successively, then, the signals sampled and held by said $(2^k-1)$ switched capacitors are added to the signal sampled and held by said switched capacitor common to said switched-capacitor filter and said prefilter, and the sum signals are supplied to said switched-capacitor filter synchronously with said primary clock pulses.

2. A prefilter as set forth in claim 1, wherein the first through last sampled and held signals in said $(2^k-1)$ units of switched capacitors are delayed successively by times $T/2^k$, $2T/2^k$, $3T/2^k$, . . . $(2^k-1)$ $T/2^k$, respectively, and are added to said sampled and held signal in said switched capacitor common to said switched-capacitor filter.

3. A prefilter as set forth in claim 1, wherein said signals sampled and held first through last in said $2^k$ units of switched capacitors are stored temporarily and are then discharged simultaneously when the sampled and held signal in said switched capacitor common to said switched-capacitor filter is discharged.

4. A prefilter as set forth in claim 3, wherein all said switched capacitors are connected in parallel with each other.

5. A prefilter as set forth in claim 4, wherein each said switched capacitor comprises a capacitor, two terminals, and switching means for selectively connecting said capacitor to one or the other of said two terminals.

6. A prefilter as set forth in claim 5, wherein each said switching means comprises two FETs, one of said FETs operating to charge said capacitor of each said switched capacitor, and another of said FETs operating to discharge said capacitor of each said switched capacitor.

7. A prefilter as set forth in claim 6, wherein said respective FETs for charging said switched capacitors are made conductive sequentially, but said respective FETs for discharging said switched capacitors are made conductive simultaneously at a time which is synchronous with said primary clock pulses.

8. A prefilter for the input stage of a switched-capacitor filter, comprising:
   a first switched capacitor and a second switched capacitor, both connected in series, and
   a third switched capacitor, common to the switched-capacitor filter, connected in parallel with said series connected first and second switched capacitors,
   each said switched capacitor comprising two terminals, a capacitor, and switching means for selectively connecting said capacitor to one or the other of said two terminals; and
   said switching means of said second switched capacitor operating in phase with said switching means of said third switched capacitor and said switching means of said first switched capacitor operating in opposite phase with respect to said switching means of said third switched capacitor.

9. A prefilter as set forth in claim 8, wherein each said switching means comprises two FETs (field effect transistors), one of said FETs operating to charge said capacitor of each said switched capacitor, while another of said FETs operates to discharge said capacitor of each said switched capacitor.

10. A prefilter as set forth in claim 8 or claim 9, wherein the capacitance of said third switched capacitor is approximately one-half that of said second switched capacitor, and wherein the capacitance of said second switched capacitor is approximately equal to that of said first switched capacitor.

11. A prefilter driven by first and second clock signals, said prefilter comprising:
   an input signal;
   first and second means for supplying said first and second clock signals, respectively;
   a first transistor having a first terminal connected to said input terminal, a gate connected to said second clock supplying means, and a second terminal;
   a first capacitor having one terminal thereof connected to said second terminal of said first transistor and having the other terminal thereof connected to ground;
   a second transistor having a first terminal connected to said second terminal of said first transistor, a gate connected to said first clock supplying means, and a second terminal;
   a second capacitor having one terminal thereof connected to said second terminal of said second transistor and having the other terminal thereof connected to ground;
   a third transistor having a first terminal connected to said second terminal of said second transistor, a gate connected to the second clock supplying means, and a second terminal;
   a fourth transistor having a first terminal connected to said input terminal, a gate connected to the first clock supplying means, and a second terminal;
   a third capacitor having one terminal thereof connected to said second terminal of said fourth transistor and having the other terminal thereof connected to ground;
   a fifth transistor having a first terminal connected to said second terminal of said fourth transistor, a gate connected to the second clock supplying means, and a second terminal; and
   an output terminal connected to said second terminal of said fifth transistor and to said second terminal of said third transistor.

12. The prefilter of claim 11, wherein the capacitance of said first capacitor is approximately twice that of said third first capacitor, and wherein the capacitance of said second capacitor is approximately twice that of said third capacitor.

* * * * *

UNITED STATES PATENT AND TRADEMARK OFFICE
CERTIFICATE OF CORRECTION

PATENT NO. : 4,333,064

DATED : June 1, 1982

INVENTOR(S) : Kato et al.

It is certified that error appears in the above-identified patent and that said Letters Patent is hereby corrected as shown below:

Front page, col. 2, after "Primary Examiner-Marvin L. Nussbaum" insert --Attorney, Agent, or Firm-Staas & Halsey--;

Col. 2, line 48, "a" should be --the--;

Col. 4, line 40, after "according" insert --to--;

Col. 5, line 16, "Phase" should be --The phase--;

line 66, after "characteristics" insert --of signals--;

Col. 6, line 15, "khZ" should be --kHz--.

Signed and Sealed this

Twenty-sixth Day of October 1982

[SEAL]

Attest:

GERALD J. MOSSINGHOFF

Attesting Officer

Commissioner of Patents and Trademarks